United States Patent
Zhao et al.

(10) Patent No.: US 10,886,905 B1
(45) Date of Patent: Jan. 5, 2021

(54) SIGNAL GENERATOR WITH COHERENT PHASE OUTPUT

(71) Applicant: Dialog Semiconductor B.V., s-Hertogenbosch (NL)

(72) Inventors: Duan Zhao, Utrecht (NL); Michail Papamichail, Eindoven (NL); Joek de Haas, Veldhoven (NL)

(73) Assignee: Dialog Semiconductor B.V., 's-Hertogenbosch (NL)

( * ) Notice: Subject to any disclaimer, the term of this patent is extended or adjusted under 35 U.S.C. 154(b) by 0 days.

(21) Appl. No.: 16/256,390

(22) Filed: Jan. 24, 2019

(51) Int. Cl.
| | |
|---|---|
| H03L 7/00 | (2006.01) |
| H03L 7/093 | (2006.01) |
| H03L 7/095 | (2006.01) |
| H03L 7/099 | (2006.01) |
| H03K 5/15 | (2006.01) |

(52) U.S. Cl.
CPC ....... H03K 5/15006 (2013.01); H03L 7/0992 (2013.01); H03L 7/0994 (2013.01)

(58) Field of Classification Search
CPC .. H03K 5/15006; H03L 7/0992; H03L 7/0994
See application file for complete search history.

(56) References Cited

U.S. PATENT DOCUMENTS

| | | | | |
|---|---|---|---|---|
| 10,063,246 | B2* | 8/2018 | Grouwstra | ............... H03L 7/087 |
| 10,191,453 | B2* | 1/2019 | Pavlovic | ............... G04F 10/005 |
| 10,340,926 | B2* | 7/2019 | Chillara | .................. H03K 4/90 |
| 10,340,927 | B1* | 7/2019 | Gambhir | ............... H03L 7/0992 |

OTHER PUBLICATIONS

"All-Digital PLL and Transmitter for Mobile Phones," by Robert Bogdan et al., IEEE Journal of Solid-State Circuits, vol. 40, No. 12, Dec. 2005, pp. 2469-2482.

\* cited by examiner

*Primary Examiner* — Kenneth B Wells
(74) *Attorney, Agent, or Firm* — Saile Ackerman LLC; Stephen B. Ackerman (57) ABSTRACT

A signal generator and a method which provides a source signal with a coherent phase at arbitrary times is presented. There is provided a signal generator for generating a source signal based on a reference signal. The signal generator has a phase setting circuit with a memory circuit operable between a plurality of states. The memory circuit has a phase setting input adapted to receive a phase setting value to set the memory circuit to a known state. The signal generator is adapted to load the phase setting value at a specific time to control a phase of the source signal.

15 Claims, 12 Drawing Sheets

SIGNAL GENERATOR WITH COHERENT PHASE OUTPUT

TECHNICAL FIELD

The present disclosure relates to a signal generator for generating a source signal having a controllable phase. In particular, the present disclosure related to a signal generator providing a source signal with a coherent phase at arbitrary times.

BACKGROUND

Signal generators, such as phase-locked loops PLL, are used in a wide range of applications requiring source signals for performing different tasks. For instance, a PLL may be used to provide a source signal to a wireless communications system.

In a conventional PLL, the source signal generated has a phase that follows a certain trajectory with time. However, upon reset of the PLL or by changing the PLL settings, the source signal will follow another trajectory different from the initial trajectory. In other words, the PLL output signal may take any random trajectory with a random initial phase value between 0 and $2\pi$. This loss of initial phase information upon reinitialization of the PLL means that the source signal after reinitialization is not in phase with the initial source signal, or non-coherent.

Various applications, including advance modulations, localization techniques, remote sensing and RF imaging, require the use of a coherent source signal. Phase coherency may be achieved using multiple PLLs, however this increases the complexity, power consumption as well as the cost of the system.

SUMMARY

It is an object of the disclosure to address one or more of the above-mentioned limitations.

According to a first aspect of the disclosure there is provided a signal generator for generating a source signal based on a reference signal, the signal generator comprising a phase setting circuit comprising a memory circuit operable between a plurality of states; wherein the memory circuit comprises a phase setting input adapted to receive a phase setting value to set the memory circuit to a known state; the signal generator being adapted to load the phase setting value at a specific time to control a phase of the source signal.

Optionally, the signal generator comprises a signal circuit coupled to the phase setting circuit; the signal circuit being adapted to generate the source signal based on the reference signal.

Optionally, the phase setting value is associated with a known phase difference between the reference signal and the source signal.

Optionally, the signal generator is operable between arbitrary periods in time, the arbitrary periods comprising a first period during which the signal generator provides a first source signal; and a second period during which the signal generator provides a second source signal. The arbitrary periods may include more periods.

The first period and the second period may be separated by an arbitrary time difference.

Optionally, between the first period and the second period the signal generator is deactivated and provides no source signal.

Optionally, wherein the phase setting value is based on a phase trajectory of the first source signal.

Optionally, upon loading the phase setting value, the second source signal is set to a chosen phase trajectory. The chosen phase trajectory may be set by the user of the device. For instance, the chosen trajectory may be a phase trajectory of the first source signal. The chosen trajectory may be an arbitrary phase trajectory.

Optionally, the phase setting value is function of a time difference between a start of the first period and a start of the second period, a frequency of operation of the signal generator and a frequency of the reference signal.

Optionally, the signal generator comprises a calculator for calculating the phase setting value.

Optionally, the memory circuit comprises a data input for receiving a data signal, and a load input for receiving a load signal to load the phase setting value from the phase setting input.

Optionally, the memory circuit comprises a clock input for receiving a clock signal.

Optionally, the phase setting circuit comprises an adder adapted to provide the data signal to the memory circuit.

According to a second aspect of the disclosure, there is provided a method of generating a source signal based on a reference signal, the method comprising providing a signal generator with a phase setting circuit comprising a memory circuit operable between a plurality of states; identifying a phase setting value associated with a known state of the memory circuit; and loading the phase setting value into the memory circuit at a specific time to set the memory circuit to the known state, hence controlling the phase of the source signal.

Optionally, the phase setting value is associated with a known phase difference between the reference signal and the source signal.

Optionally, the signal generator is operable between a first period during which the signal generator provides a first source signal; and a second period during which the signal generator provides a second source signal.

Optionally, wherein between the first period and the second period the signal generator is deactivated and provides no source signal.

Optionally, the method comprises identifying a phase trajectory of the first source signal and calculating the phase setting value based on the first phase trajectory.

Optionally, wherein upon loading the phase setting value, the second source signal is set to a chosen phase trajectory.

Optionally, the memory circuit comprises a data input for receiving a data signal, and a load input for receiving a load signal to load the phase setting value from the phase setting input.

The options described with respect to the first aspect of the disclosure are also common to the second aspect of the disclosure.

BRIEF DESCRIPTION OF THE DRAWINGS

The disclosure is described in further detail below by way of example and with reference to the accompanying drawings, in which.

DESCRIPTION

Figure 1:
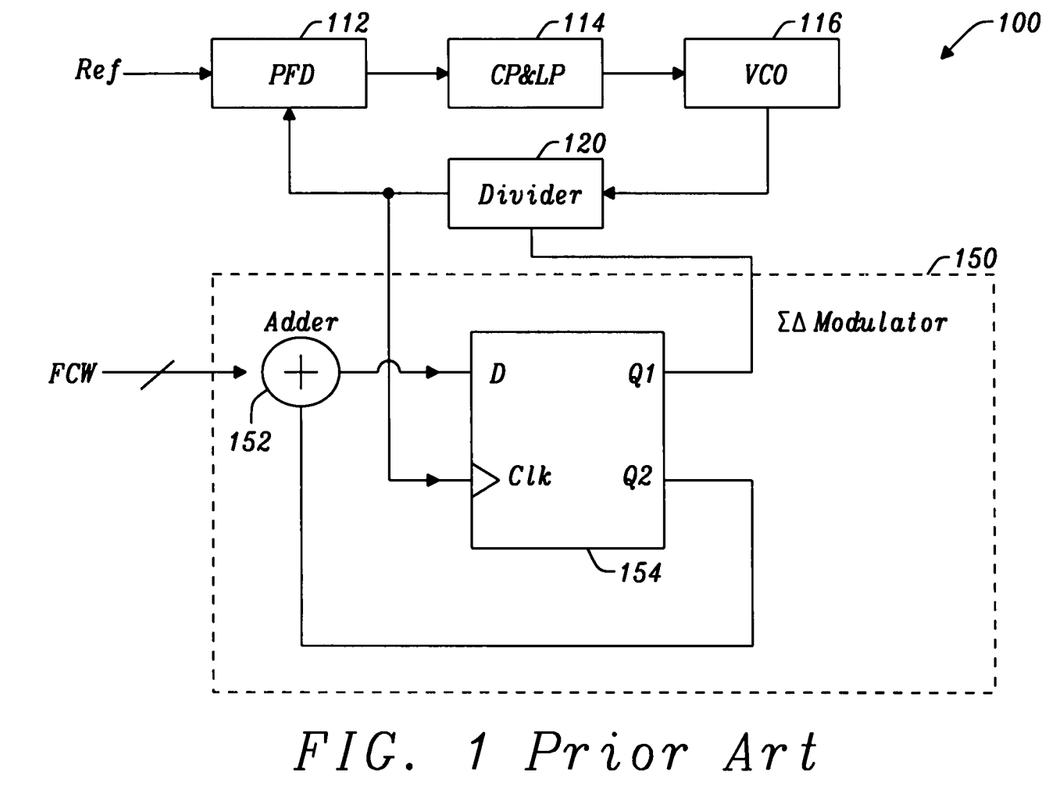
FIG. 1 is a diagram of a PLL signal generator.

FIG. 1 illustrates a sigma-delta phase locked loop SD-PLL 100. The SD-PLL 100 includes a phase frequency detector (PFD) 112, a charge pump and loop filter (CP&LP) 114, a voltage-controlled oscillator (VCO) 116, a fractional divider 120, and a sigma-delta modulator 150.

The phase frequency detector 112 has a first input for receiving a reference signal, a second input for receiving a feedback signal from the fractional divider 120 and an output connected to the loop filter 114. The voltage-controlled oscillator 116 has an input for receiving a signal from the loop filter 114 and an output for providing an output signal also referred to as the source signal. The divider 120 has a first input for receiving the output signal from the voltage-controlled oscillator 116, a second input for receiving a control signal from the sigma-delta modulator 150, and an output connected to the phase frequency detector 112.

The sigma-delta modulator 150 includes an adder 152 connected to a flip flop 154. The flip flop 154 has a data input D for receiving the output of the adder 152, a clock input for receiving the divider output, and two outputs Q1 and Q2. The first output Q1 is connected to an input of the divider 120 and provides the most significant bit (MSB) of the adder output. The second output Q2 is connected to the adder 152 and provides the residue of the adder output.

In operation, the phase frequency detector 112 receives a reference signal having a frequency Fref and the voltage-controlled oscillator 116 outputs a signal having a frequency Fout. The fractional divider 120 receives the output signal and the control signal from the modulator 150 and generates a feedback signal having a frequency equals to Fout/N, in which N is an integer referred to as the divider ratio. The phase frequency detector 112 compares the reference signal with the feedback signal (divided version of the output signal) and generates an error signal. The error signal is filtered by the loop filter 114 and provided to the voltage-controlled oscillator 116 to adjust the VCO frequency up or down until the reference signal is in phase with the feedback signal. The negative feedback loop provided by the fractional divider 120 reduces the error signal to approach zero. At this point, the output signal has an output frequency Fout equals to N times the reference frequency Fref. The modulator 150 varies the divider coefficient N over time such that the averaged <N> value results is a desired fractional value. For instance, a repeated sequence of N=11,11,11,10 would result in an average <N> value of 10.75. In this way, a signal output may be generated with various frequencies with integer and non-integer divider ratios, depending on the application.

Figure 2:
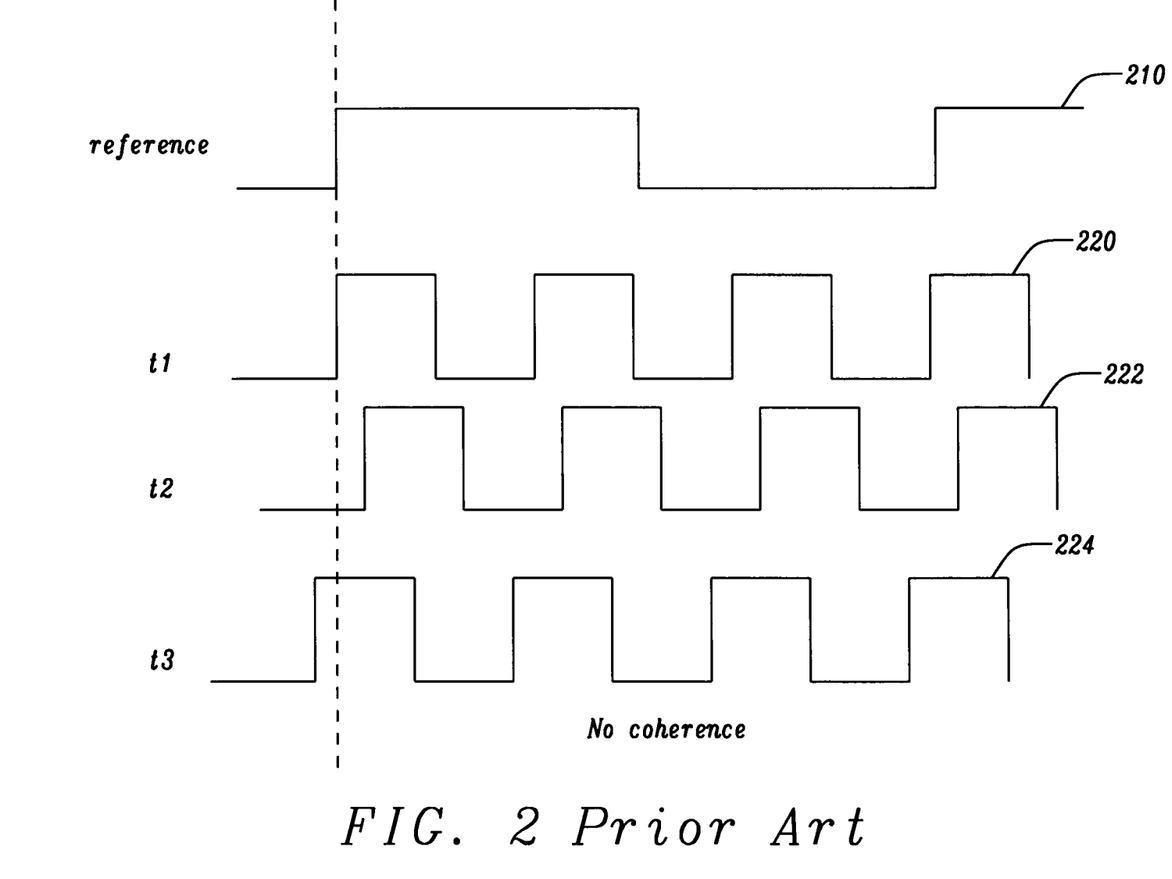
FIG. 2 is a time chart including the waveforms of a reference signal and an output signal of the circuit of FIG. 1 for different time slots.

FIG. 2 shows the waveforms of a reference signal 210 and the output signal generated by the circuit of FIG. 1, for three different time slots illustrated by waveforms 220, 222 and 224 respectively. A first time slot starts at time t1, a second time slot starts a time t2 and a third time slot starts at time t3.

In this example, the output signal has a frequency that is twice the frequency of the reference signal. The output signal 220 generated at time t1 has a phase difference with the reference signal $\Delta\varphi_1=0$. When the PLL generator is switched off and restarted at time t2, the output signal generated at time t2 has a phase difference with the reference signal that is positive $\Delta\varphi_2>0$. When the PLL generator is switched off and restarted at time t3, the output signal generated at time t3 has a phase difference with the reference signal that is negative $\Delta\varphi_3<0$. Each time the PLL generator is switched off and restarted the phase of the output signal with respect to the reference signal changes to a random value between 0 and $2\pi$. As a result, the phase information is lost and there is no coherence between the output signals 220 generated during the first slot, the output signal 222 generated during the second slot, and the third output signal 224 generated during the third slot.

Figure 3:
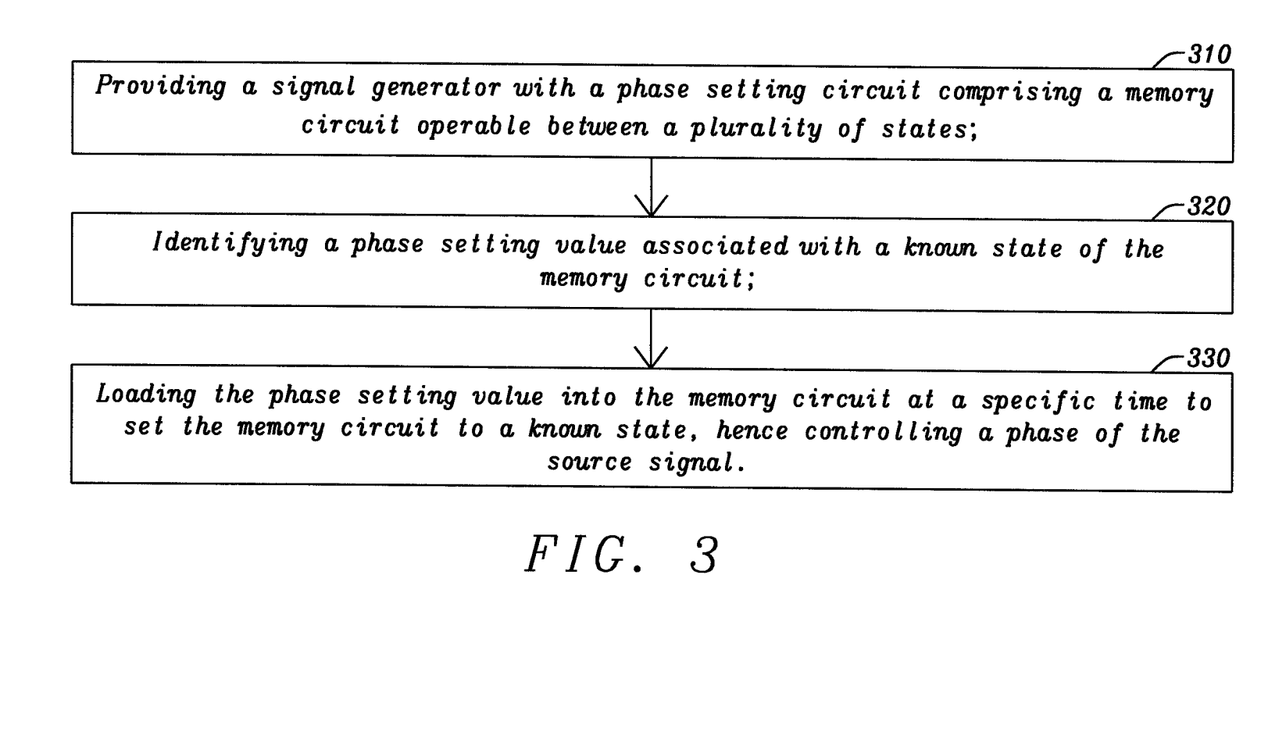
FIG. 3 is a flow chart of a method for generating a source signal according to the disclosure.

FIG. 3 is a flow chart of a method for generating a source signal based on a reference signal, such that a phase difference between the reference signal and the output signal is controlled.

At step 310, a signal generator is provided with a phase setting circuit. The phase setting circuit comprises a memory circuit operable between a plurality of states. At step 320, a phase setting value associated with a known state of the memory circuit is identified. At step 330 the phase setting value is loaded into the memory circuit at a specific time to set the memory circuit to the known state. Therefore, the method allows controlling a phase of the source signal. The known state of the memory circuit may be associated with a particular phase difference between the source signal and a reference signal.

Figure 4:
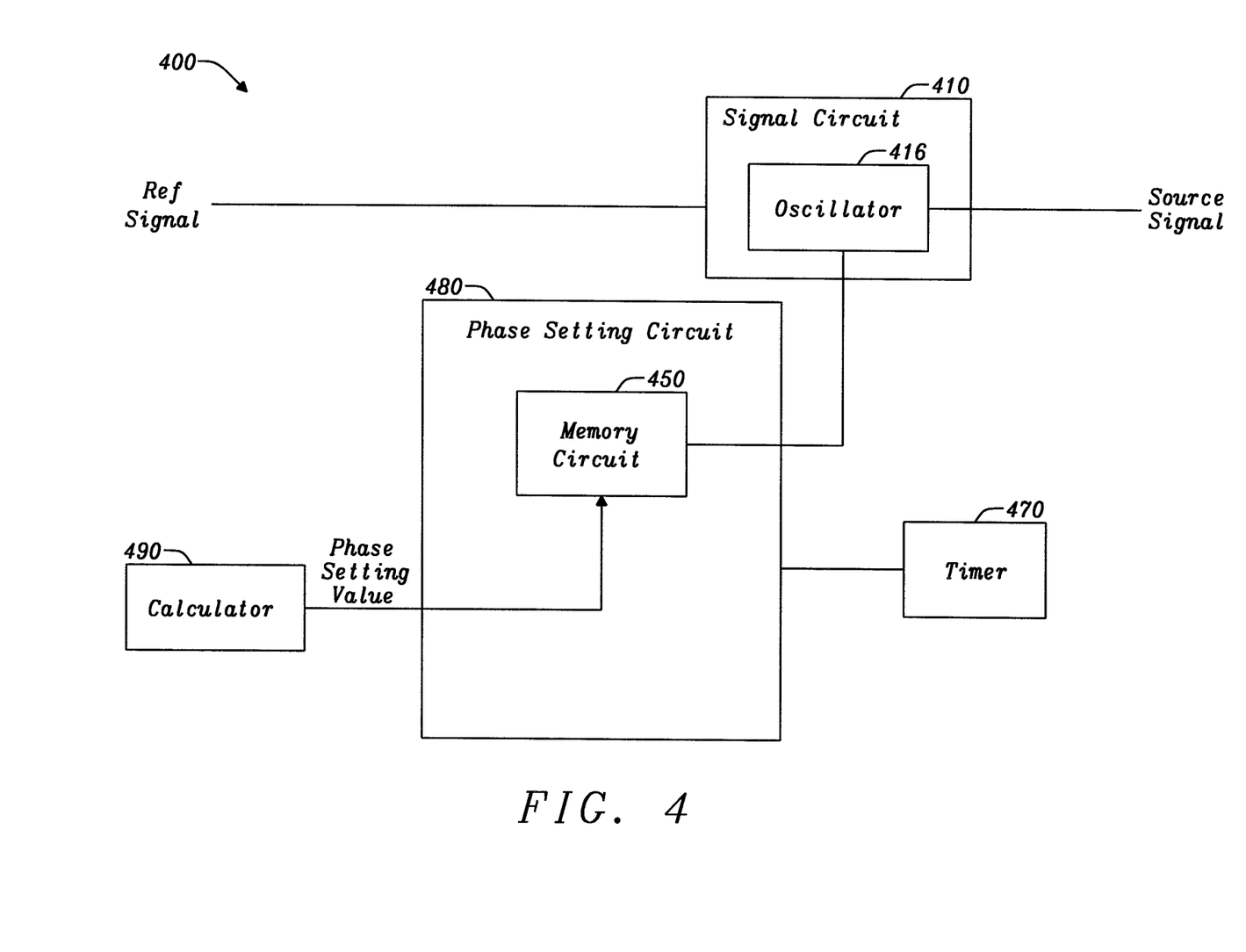
FIG. 4 is a diagram of a signal generator for implementing the method of FIG. 3.

FIG. 4 shows a diagram of a signal generator 400 for implementing the method of FIG. 3. The signal generator 400 includes a signal circuit 410 for providing the source signal, coupled to a phase setting circuit 480. For instance, the source signal may be a clock signal which may be used in another circuit for performing synchronization or signal detection functions. The signal generator may be a PLL signal generator.

The signal circuit 410 includes an oscillator 416 having a controllable oscillation frequency. For instance, the oscillator 416 may be a voltage-controlled oscillator or a digitally-controlled oscillator. The phase setting circuit 480 is provided with a memory circuit 450 operable between a plurality of states. The memory circuit 450 is adapted to store state information and to change state upon receipt of a control input signal. The memory circuit 450 has a phase setting input for receiving a phase setting value. For instance, the phase setting value may be provided by a calculator 490. The memory circuit 450 may include a logic circuit, for instance a sequential logic circuit such as a flip-flop or a latch. A timer 470 coupled to the memory circuit 450 is provided for loading the phase setting value at a specific time. For instance, the timer 470 may send a load signal to the memory circuit 450, such that the phase setting value is loaded to the memory circuit 450 at this precise moment.

In operation, the signal circuit 410 receives a reference signal having a reference frequency. For instance, the reference signal may be generated by a crystal oscillator. When the signal generator 400 is reset, the memory circuit 450 loads a phase setting value from the calculator 490 or from a storage medium. The phase setting value is associated with a known phase difference between the reference signal and the output phase signal. Hence, by loading the phase setting value at a reset time, the signal generator 400 provides the source signal with a known phase with respect to the reference signal. The signal generator 400 may provide different source signals at different times and is not required to remain active between the generation of different source signals in order to control a phase of the source signal. This lowers the power consumption of the device.

Figure 5:
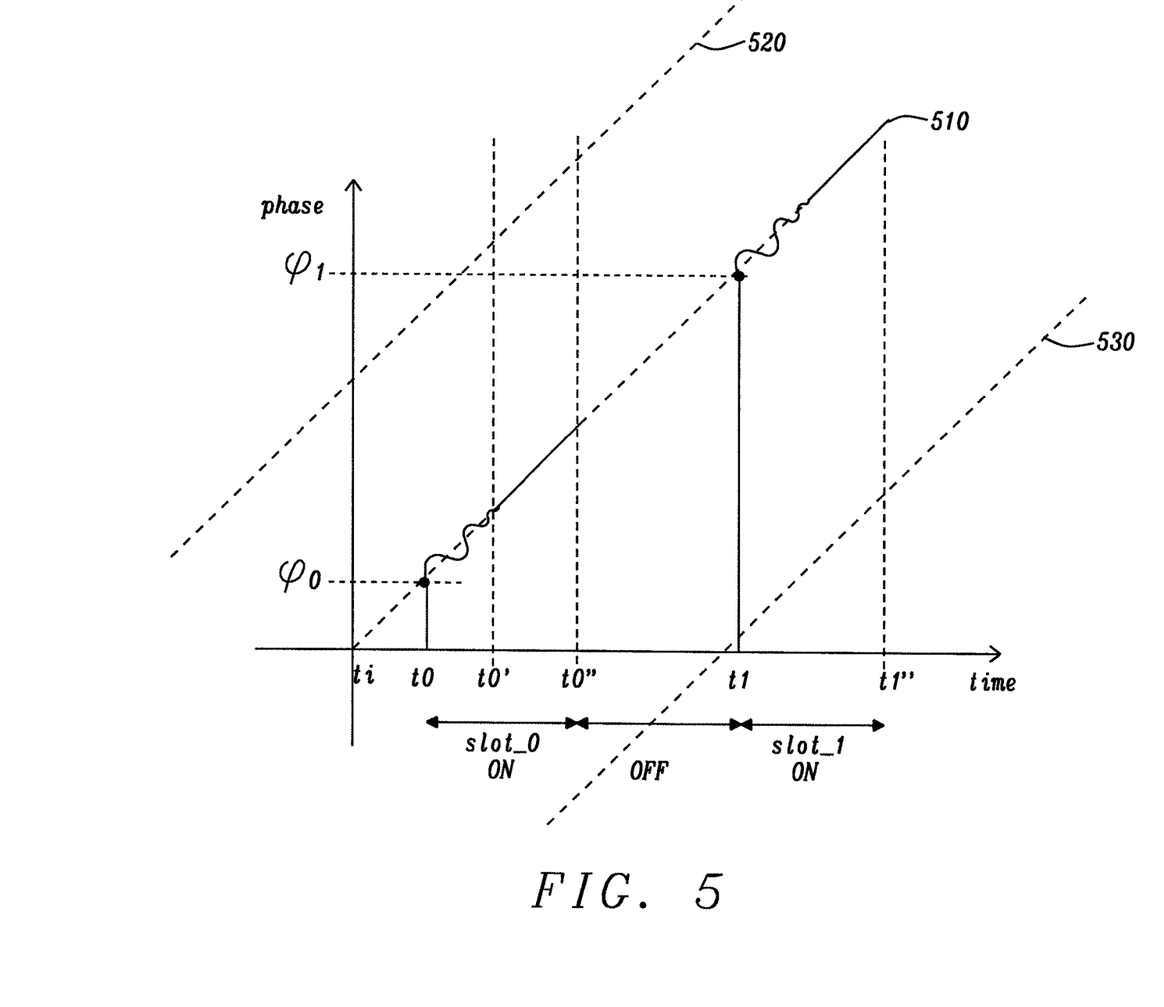
FIG. 5 is a diagram illustrating three possible phase trajectories of the same frequency, each trajectory being obtained for the same frequency of operation but with different initial phase values.

FIG. 5 shows the phase of the output signal of the circuit of FIG. 4 as a function of time. The phase p of the output signal evolves with time and may be expressed as the product of the angular frequency ω of the signal with time t. Therefore, the phase follows with time a known phase trajectory.

FIG. 5 illustrates three arbitrary phase trajectories labelled 510, 520 and 530 for a same frequency of operation but with different initial phase values with respect to the reference signal at an initial time ti. At the initial time ti, the phase trajectory 510 has a zero-phase value with respect to the reference signal, while the phase trajectory 520 has a positive phase value and the phase trajectory 530 has a negative phase value.

In this example the signal generator is activated (switched on) during a first time window between a time t0 and a time t0", also referred to as slot_0; and during a second time window between a time t1 and t1", also referred to as slot_1. Between the slots slot_0 and slot_1 the signal generator is de-activated and generates no source signal. An initial phase setting value RV0 may be chosen to follow a particular trajectory. In the present example the phase setting value RV0 is selected before a time t0 to follow the trajectory 510. At time t0, a load signal is asserted, and the signal generator 400 loads the phase setting value RV0 in the memory circuit 450. The signal generator 400 starts to operate at a frequency f0 (corresponding to angular frequency W0). The phase of the output signal $\varphi_0$ to with respect to the reference signal, and start following the phase trajectory 510. The phase may vary until time t0' when the signal generators stabilises. At time t0" the signal generator is deactivated (switched off). As a result, the state of the memory circuit is lost.

As discussed above, the phase of the output signal when the system is re-activated may follow any trajectory; that is, a trajectory different from the trajectory followed by the output signal between the times t0 and t0" (slot_0). For instance, the output signal may follow trajectory 520 or trajectory 530. In order for the phase of the output signal to follow the same trajectory 510, the phase at time t1 should be $\varphi_1$. To achieve this, a phase setting value RV1, can be loaded in the memory circuit at time t1. The phase setting value RV1 may be expressed as:

$$RV_1 = RV_0 + f((t1-t0), F_{ref}, F0)$$

in which RV0 is the initial phase setting value RV0 at time t0 and f is a function which depends on the implementation of the signal generator. The function f has three parameters: i) the time difference (t1−t0) between the start of slot_0 and the start of slot_1; ii) the operation frequency f0 of the signal generator or the frequency control word (FCW); and iii) the frequency of the reference signal Fref. The value RV1 may be calculated in advance and stored in a storage medium such as a register. At time t1, the signal generator receives a load signal for loading the phase setting value RV1.

Figure 6:
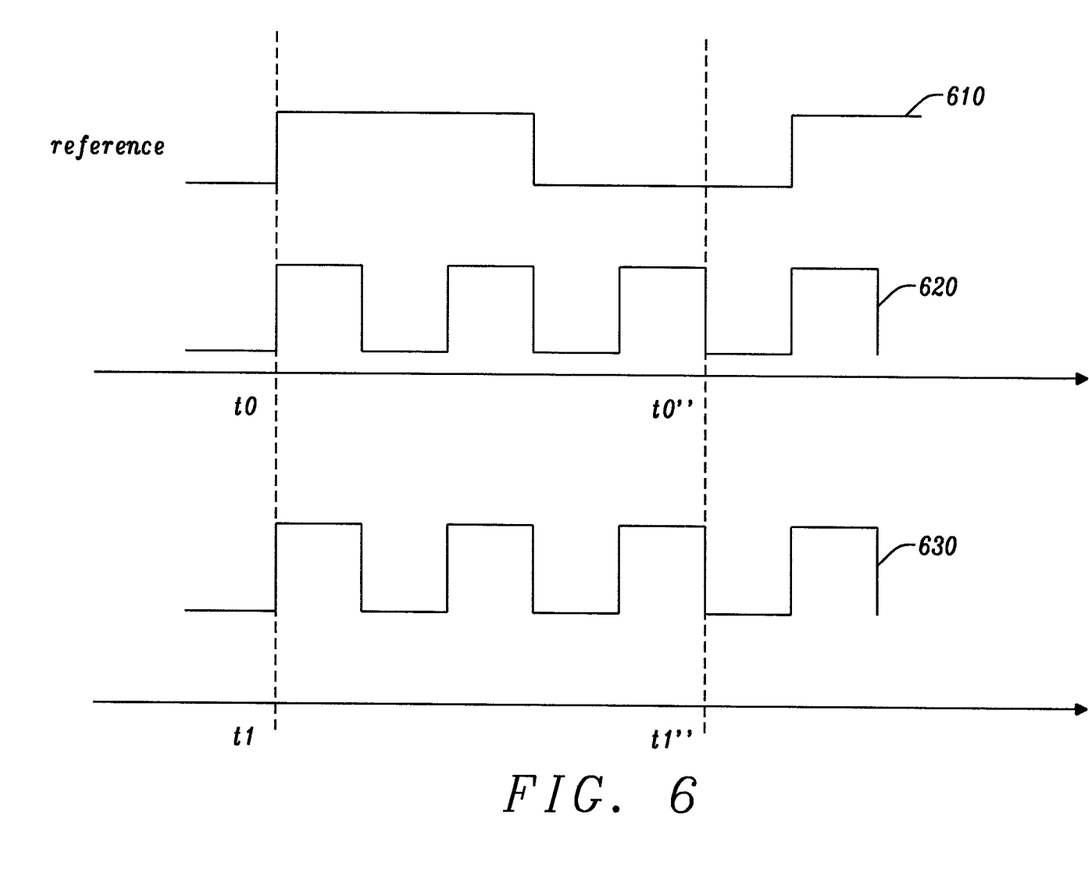
FIG. 6 is an example time chart including the waveforms of a reference signal and an output signal of the circuit of FIG. 4 obtained for two time slots.

FIG. 6 is a time chart showing the reference signal 610, the first output signal 620 generated between times t0 and t0" (slot 0) and the second signal output 630 generated between times t1 and t1" (slot 1). The two output signals 620 and 630 are coherent and follow the same trajectory 510. A coherent output signal is referred as a signal following the same trajectory at different time periods.

Figure 7:
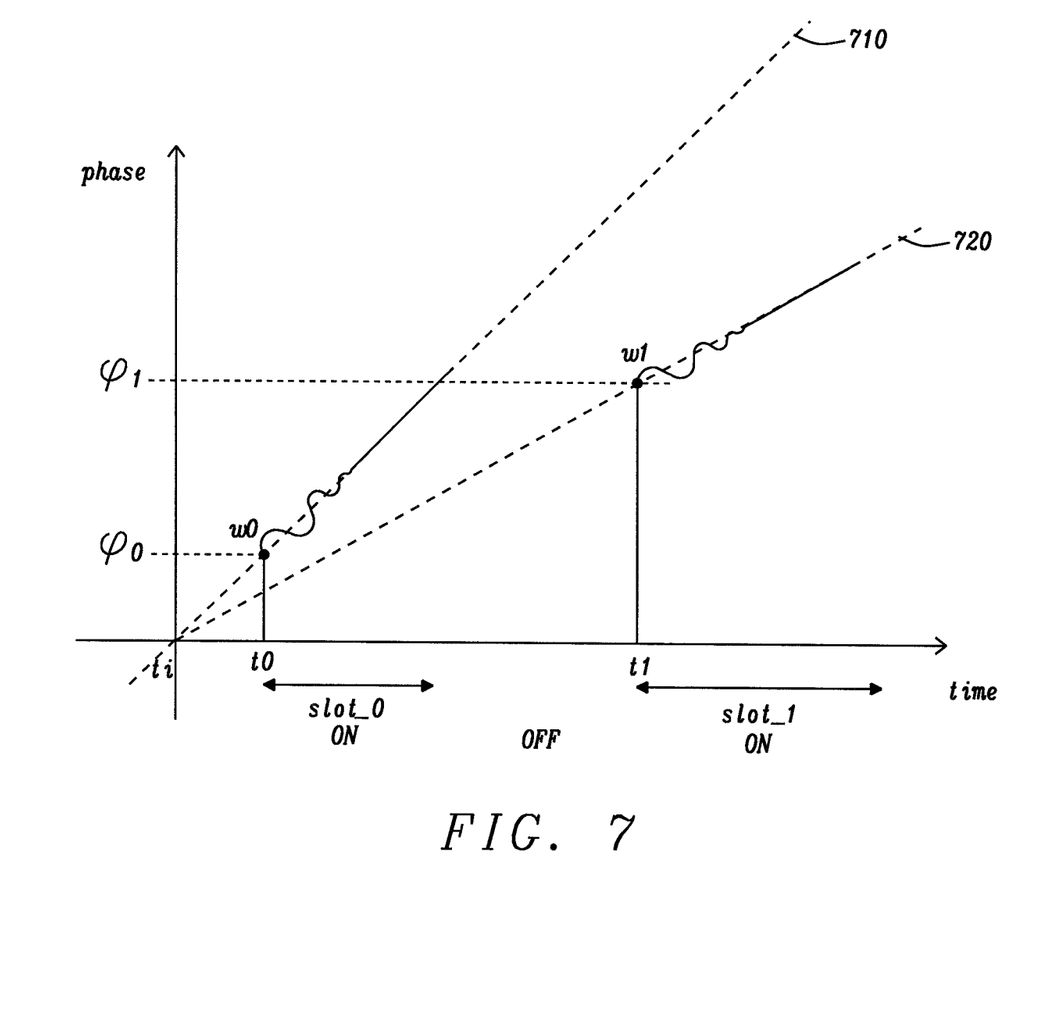
FIG. 7 is a diagram illustrating two phase trajectories of the phase of a coherent output signal of the signal generator of FIG. 4, each trajectory being obtained for a different frequency.

FIG. 7 is another diagram of the phase of the output signal of the signal generator 400 of FIG. 4 as a function of time. In this example, the signal generator 400 is operating with a first frequency F0 (corresponding to angular frequency W0) during a first time window (slot_0) and a second frequency F1 (corresponding to angular frequency W1) during a second time window (Slot_1). For instance, the second frequency F1 may be an arbitrary frequency other than F0.

At time t0, the memory circuit loads the phase setting value RV0. During the time slot_0, the signal output follows a first phase trajectory 710, with the frequency W0. At time t1, the memory circuit loads another phase setting value RV1. During the time slot_1, the signal output follows a second phase trajectory 720, with a frequency W1. In this example, the phase setting value RV1 may be expressed as:

$$RV_1 = RV_0 + f((t1-t0), F_{ref}, (F_1-F_0))$$

As shown in FIG. 7, the phase trajectories 710 and 720 share the same starting point at the initial time ti on the time axis and are therefore coherent.

Figure 8:
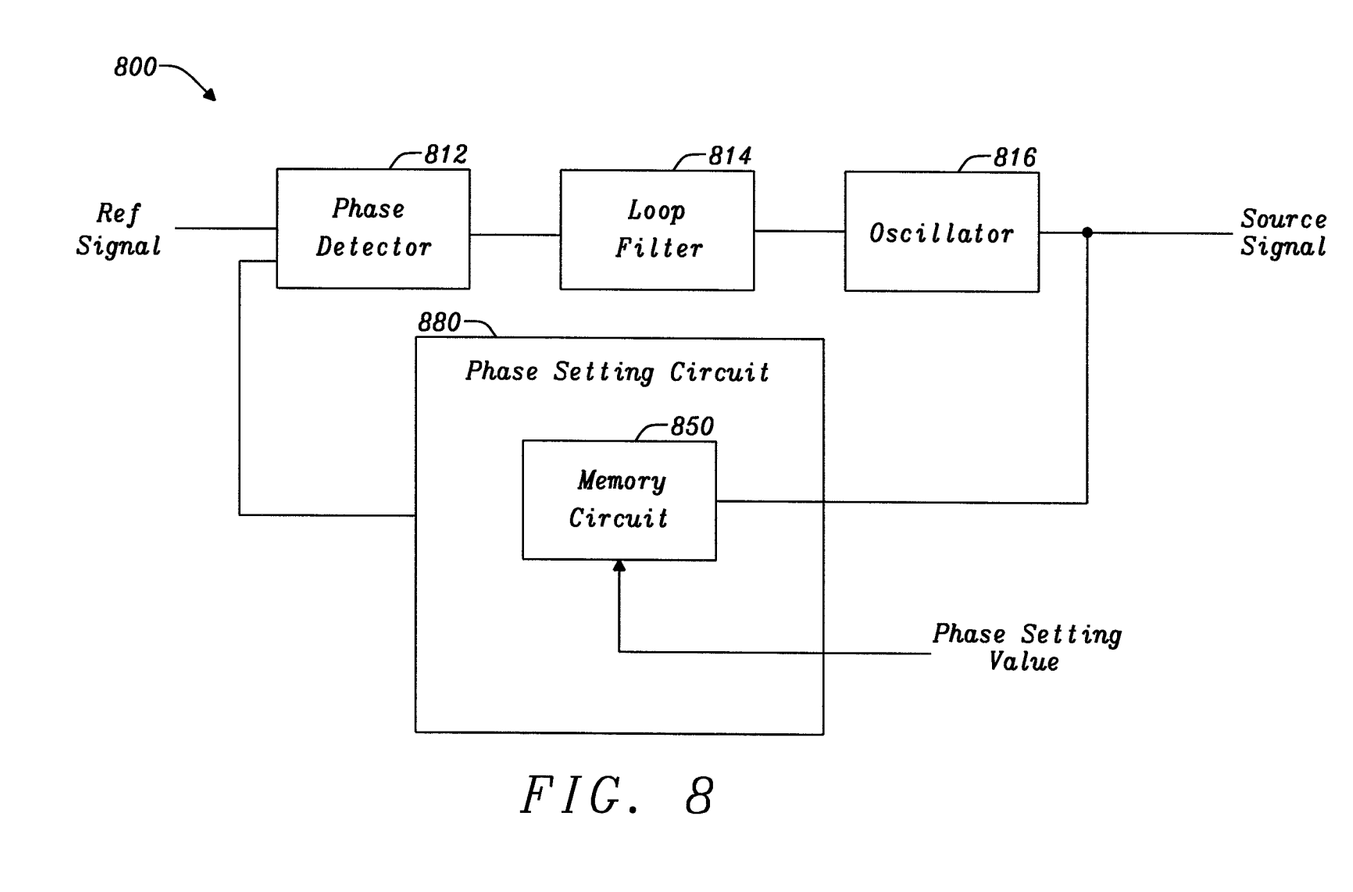
FIG. 8 is a diagram of a PLL signal generator for implementing the method of FIG. 3.

FIG. 8 shows an exemplary embodiment of the signal generator of FIG. 4, in which the phase setting circuit is coupled to the output of a PLL signal generator. The circuit includes a phase detector 812 coupled to an oscillator 816 having a controllable oscillation frequency, via a loop filter 814. A phase setting circuit 880 is provided with a memory circuit 850. The output of the memory circuit 850 is coupled to the output of the oscillator 816.

Figure 9:
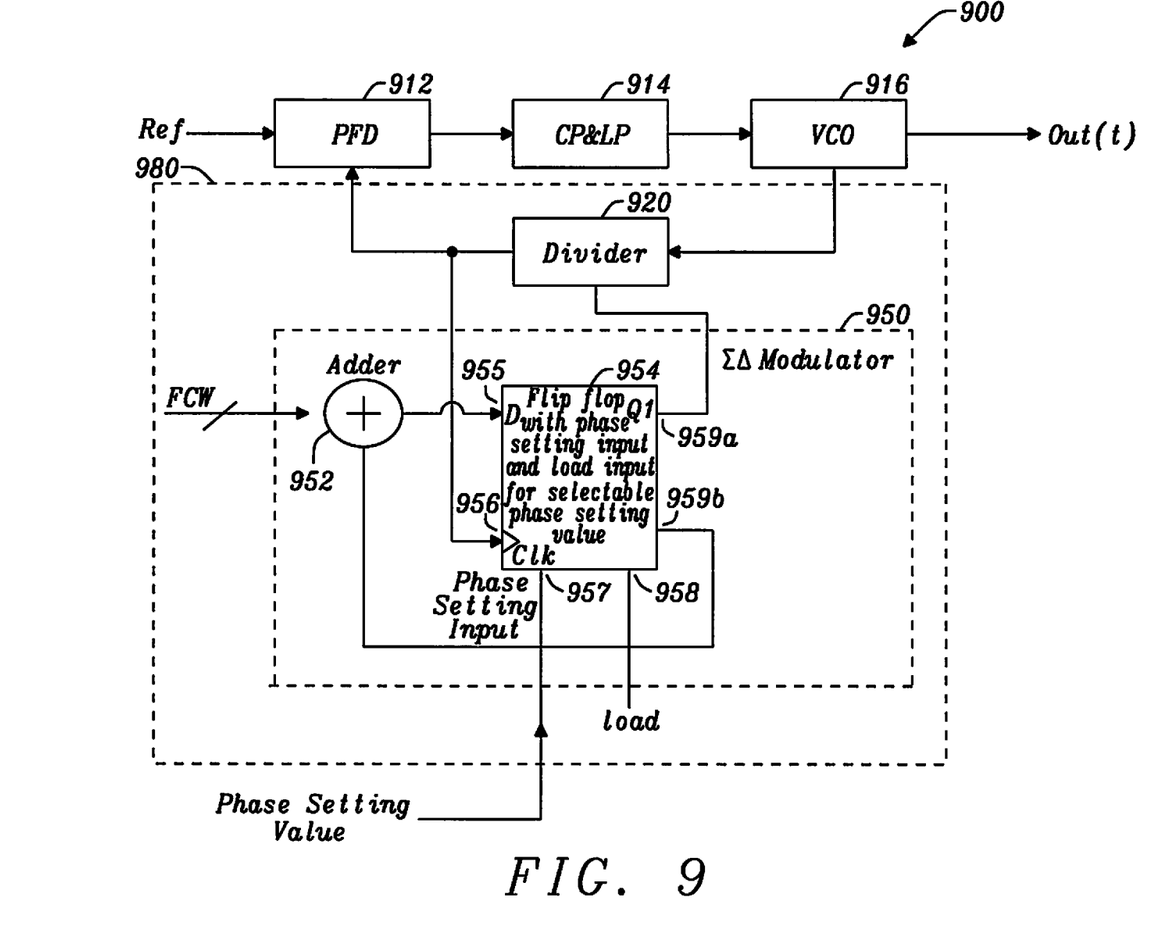
FIG. 9 is an exemplary embodiment of a PLL signal generator according to FIG. 8.

FIG. 9 illustrates an exemplary embodiment of the circuit of FIG. 8. The circuit 900 includes a phase detector 912 coupled to a voltage controlled oscillator 916, via a loop filter 914. A phase setting circuit 980 is provided with a fractional divider 920, and a sigma-delta modulator 950. The fractional divider 920 has a first input for receiving the output signal from the voltage-controlled oscillator 916, a second input for receiving a control signal from the sigma-delta modulator 950, and an output connected to the phase frequency detector 912.

The sigma-delta modulator 950 includes an adder 952 coupled to a flip-flop with phase setting input and load input for selectable phase setting value 954. The flip flop 954 has four inputs 955, 956, 957, 958 and two outputs 959a and 959b. The four inputs include a data input D 955 for receiving the output of the adder 952, a clock input 956 for receiving the divider output, a phase setting input 957 for receiving a phase setting value, and a load input 958 for receiving a load signal. A first output Q1 959a is connected to an input of the divider 920 and provides the most significant bit (MSB) of the adder output. The second output Q2 959b is connected to an input of the adder 952 and provides the residue of the adder output. The adder 952 has a first input for receiving a frequency control word FCW, and a second input coupled to Q2.

The PLL circuit 900 of FIG. 9 operates in a similar fashion as the PLL circuit of FIG. 1. However, in this case when the PLL is de-activated and subsequently re-activated, the state of the flip-flop with phase setting input and load input for selectable phase setting value 954 is controlled by loading a phase setting value via the phase setting input 957. As a result, the phase of the output signal follows a desired phase trajectory as illustrated above in connection to FIGS. 5, 6 and 7.

Figure 10:
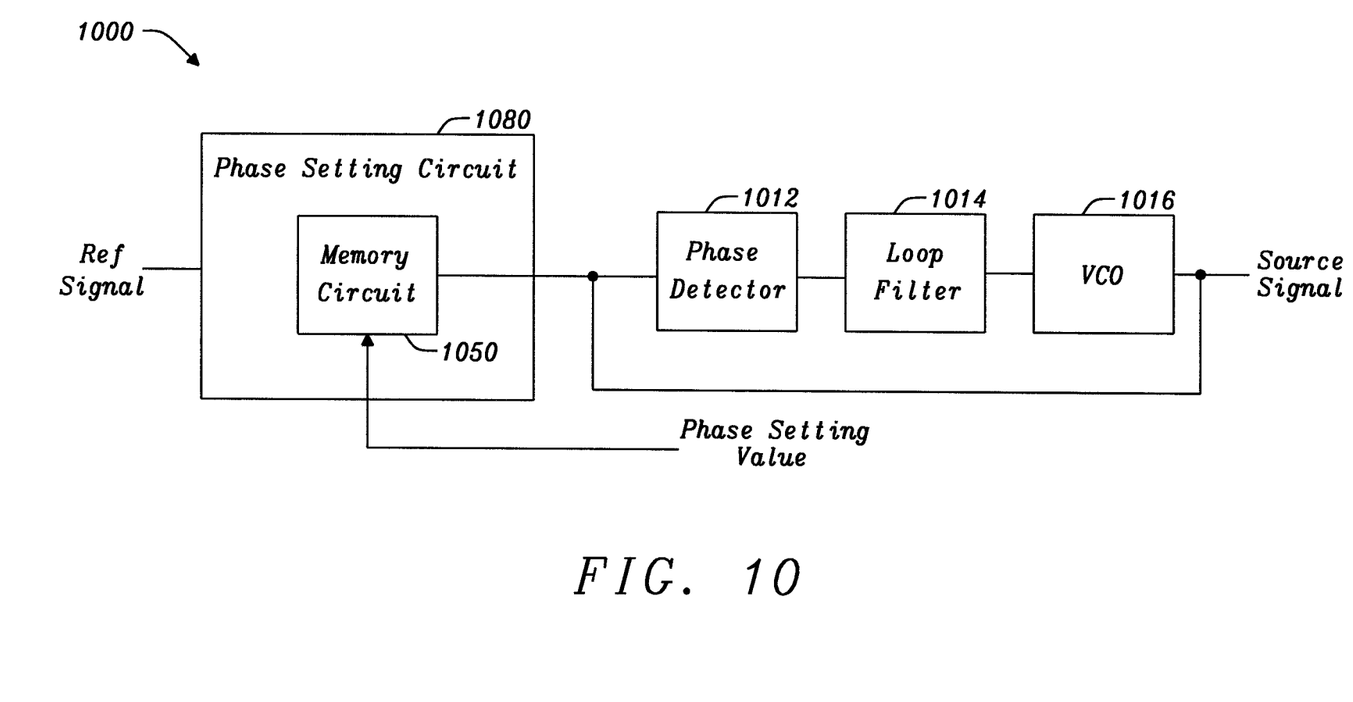
FIG. 10 is a diagram of another PLL signal generator for implementing the method of FIG. 3.

FIG. 10 shows another embodiment of the signal generator of FIG. 4, in which the phase setting circuit is coupled to the input of a PLL signal generator. The circuit 1000 includes a phase detector 1012 coupled to a voltage-controlled oscillator 1016 via a loop filter 1014. A phase setting circuit 1080 is provided with a memory circuit 1050. The memory circuit 1050 is coupled to the phase detector 1012.

Figure 11:
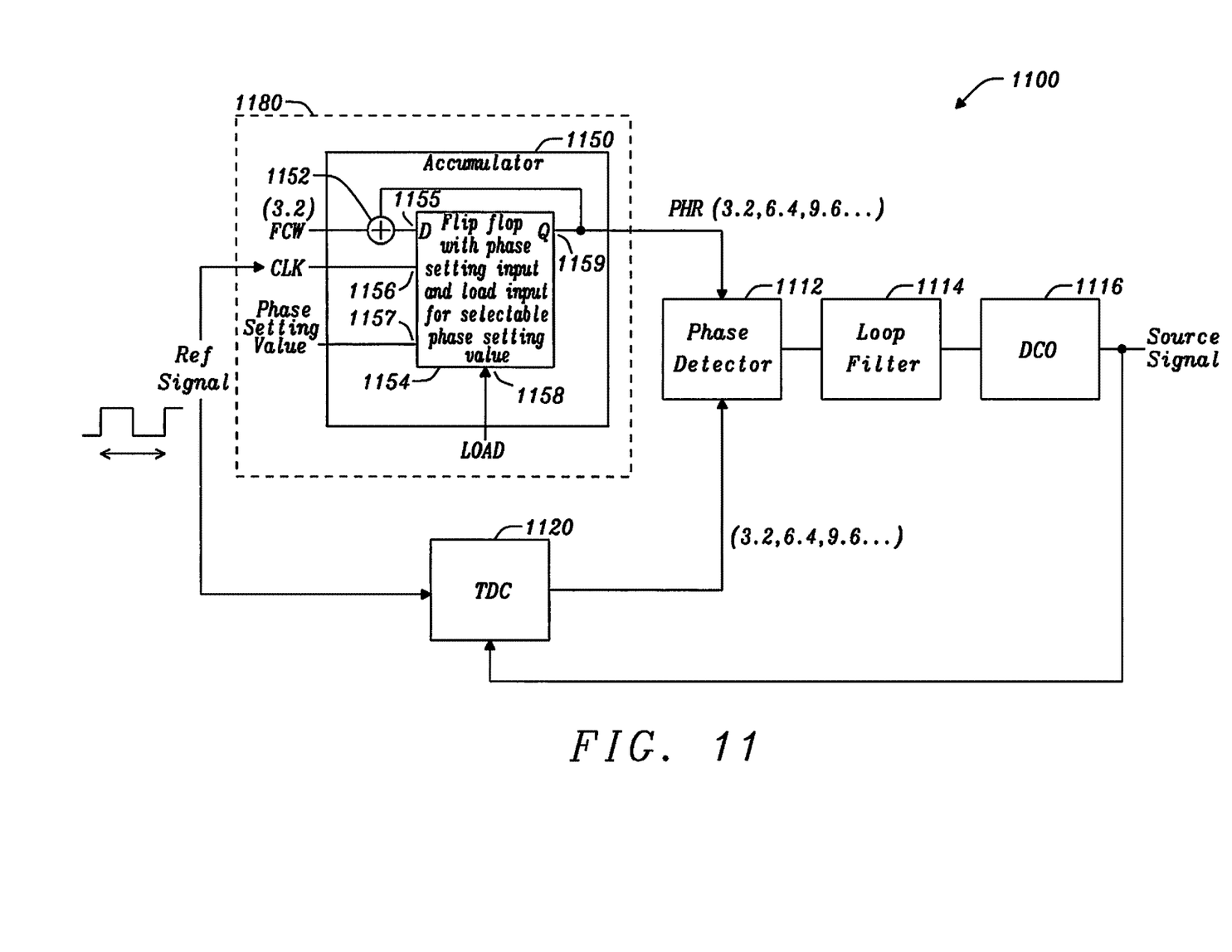
FIG. 11 is an exemplary embodiment of a PLL signal generator according to FIG. 10.

FIG. 11 illustrates an exemplary embodiment of the circuit of FIG. 10. The circuit 1100 is a divider-less PLL provided with a phase setting circuit 1180. The circuit includes a phase detector 1112 coupled to a digitally-controlled oscillator 1116 via a loop filter 1114. A phase setting circuit 1180 is provided with an accumulator 1150.

The phase detector 1112 has a first input coupled to the phase setting circuit 1180, and a second input coupled to a time to digital converter TDC 1120. The time to digital converter TDC 1120 has a first input coupled to the DCO 1116 and a second input for receiving the reference signal. The accumulator 1150 includes an adder 1152 coupled to a flip-flop with phase setting input and load input for selectable phase setting value 1154. The flip-flop 1154 is equipped with four inputs 1155, 1156, 1157, 1158 and one output Q 1159 for providing a phase reference signal PHR. The inputs include a data input D 1155 for receiving the output of the adder 1152; a clock input 1156 for receiving a clock signal; a phase setting input 1157 for receiving a phase setting value; and a load input 1158 for receiving a load signal. The adder 1152 has a first input for receiving a frequency control word (FCW), a second input coupled to the output Q and one output coupled to the data input D of the flip-flop with phase setting input and load input for selectable phase setting value 1154.

Figure 12:
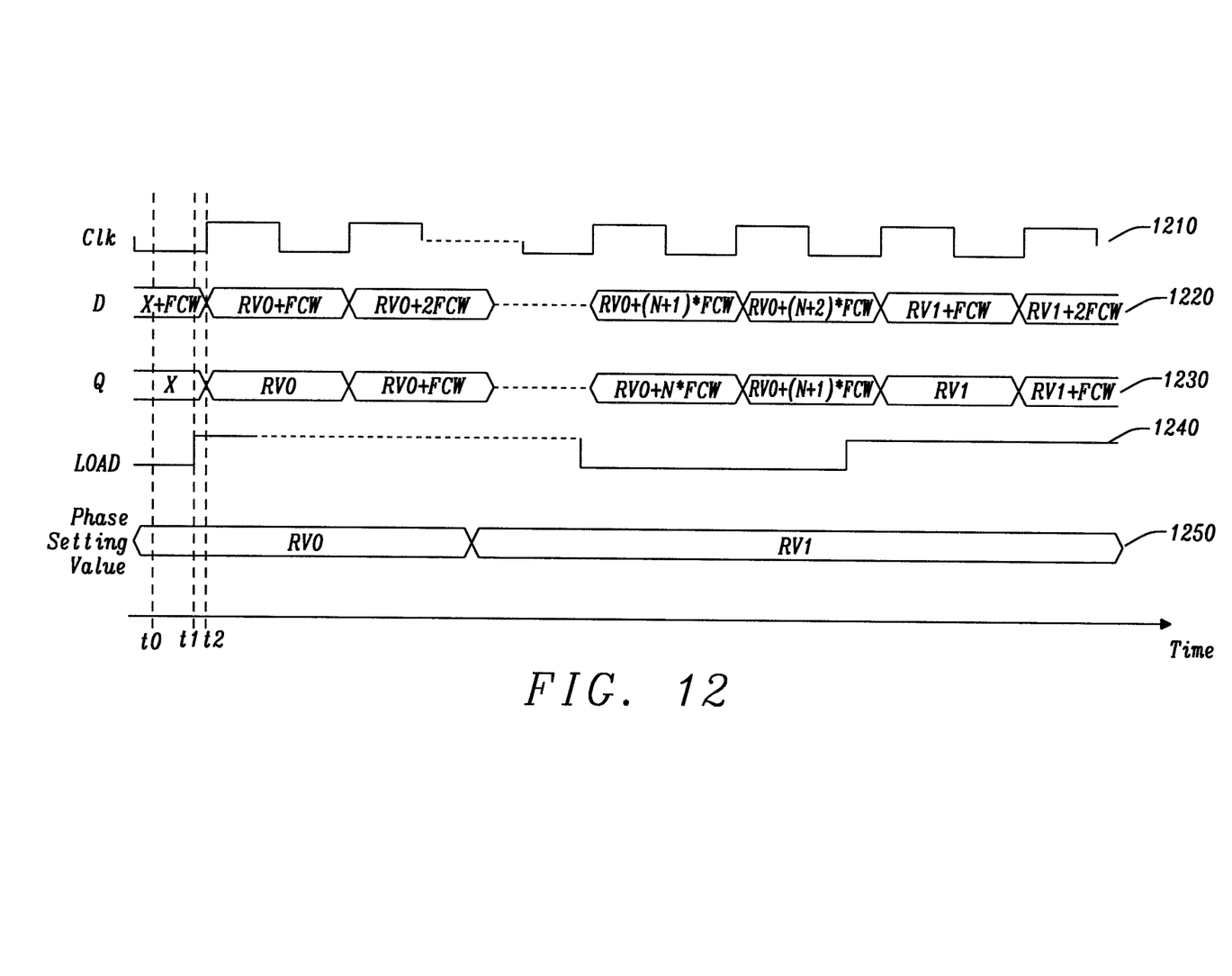
FIG. 12 is a time chart illustrating the working of the PLL signal generator of FIG. 11.

FIG. 12 is a time chart illustrating the working of the PLL signal generator of FIG. 11. FIG. 12 shows a clock signal 1210, a data signal 1220, an output signal 1230, a load signal 1240 and a phase setting value signal 1250.

In operation, the phase accumulator 1150 holds a value at its output Q. At each clock cycle, the phase accumulator 1150 adds a frequency control value to the value held at its output, hence producing a new output value. In this example, the phase accumulator is clocked by a reference signal having a period T, and the clock sample is provided on the rising edge of the reference signal. At an initial time t0, the output Q 1230 is X and the data signal 1220 is X+FCW. For example, the initial output X of the accumulator may be zero. The data signal 1220 increases by FCW at each clock cycle. For instance, if the frequency control word FCW is 3.2, the data signal 1220 increases to 3.2 at the first clock cycle, then to 6.4 at the second clock cycle and so forth. When the load signal 1240 goes high at time t1, the flip flop with phase setting input and load input for selectable phase setting value 1154 loads the phase setting value RV0 such that at time t2, when the clock signal 1210 goes high, the data signal 1220 becomes RV0+FCW, and the output signal becomes RV0.

The TDC 1120 outputs a signal at each clock cycle, representing the phase of the DCO output signal with respect to the reference signal. For example, the TDC 1120 may be implemented as a high frequency counter together with a delay-chain based time to digital converter. The phase detector 1112 compares the output Q of the accumulator 1150 with the output of the TDC, and outputs an error signal to adjust the oscillating frequency of the DCO 1116.

A skilled person will appreciate that variations of the disclosed arrangements are possible without departing from the disclosure. Accordingly, the above description of the specific embodiments is made by way of example only and not for the purposes of limitation. It will be clear to the skilled person that minor modifications may be made without significant changes to the operation described.

What is claimed is:

1. A signal generator for generating a source signal based on a reference signal, the signal generator comprising,
a phase setting circuit comprising a memory circuit operable between a plurality of states;
wherein the memory circuit comprises a phase setting input adapted to receive a pre-determined phase setting value to set the memory circuit to a known state;
wherein the source signal has a phase difference with respect to the reference signal;
wherein upon reset, the signal generator is adapted to load a selected pre-determined phase setting value at a specific time to set the phase difference to a chosen value, so that the phase of the source signal follows a chosen phase trajectory;
wherein the signal generator is operable between arbitrary periods in time, the arbitrary periods comprising a first period during which the signal generator provides a first source signal, and a second period during which the signal generator provides a second source signal;
wherein the signal generator further comprises a calculator configured to calculate the pre-determined phase setting value as a function of a time difference between a start of the first period and a start of the second period, a frequency of operation of the signal generator and a frequency of the reference signal.

2. The signal generator as claimed in claim 1, wherein the signal generator comprises a signal circuit coupled to the phase setting circuit; the signal circuit being adapted to generate the source signal based on the reference signal.

3. The signal generator as claimed in claim 1, wherein the pre-determined phase setting value is associated with a known phase difference between the reference signal and the source signal.

4. The signal generator as claimed in claim 1, wherein between the first period and the second period the signal generator is deactivated and provides no source signal.

5. The signal generator as claimed in claim 1, wherein the selected pre-determined phase setting value is based on a phase trajectory of the first source signal.

6. The signal generator as claimed in claim 1, wherein upon loading the selected pre-determined phase setting value, the second source signal is set to the chosen phase trajectory.

7. The signal generator as claimed in claim 1, wherein the memory circuit further comprises a data input for receiving a data signal, and a load input for receiving a load signal to load the selected pre-determined phase setting value from the phase setting input.

8. The signal generator as claimed in claim 1, wherein the memory circuit further comprises a clock input for receiving a clock signal.

9. The signal generator as claimed in claim 7, wherein the phase setting circuit further comprises an adder adapted to provide the data signal to the memory circuit.

10. A method of generating a source signal based on a reference signal, wherein the source signal has a phase difference with respect to the reference signal, the method comprising,
- providing a signal generator with a phase setting circuit comprising a memory circuit operable between a plurality of states;
- providing a pre-determined phase setting value associated with a known state of the memory circuit; and
- upon reset of the signal generator, selecting and loading the pre-determined phase setting value into the memory circuit at a specific time to set the phase difference to a chosen value, so that the phase of the source signal follows a chosen phase trajectory;
- wherein the signal generator is operable between arbitrary periods in time, the arbitrary periods comprising a first period during which the signal generator provides a first source signal, and a second period during which the signal generator provides a second source signal;
- wherein the signal generator further comprises a calculator configured to calculate the pre-determined phase setting value as a function of a time difference between a start of the first period and a start of the second period, a frequency of operation of the signal generator and a frequency of the reference signal.

11. The method as claimed in claim 10, wherein the pre-determined phase setting value is associated with a known phase difference between the reference signal and the source signal.

12. The method as claimed in claim 10, wherein between the first period and the second period the signal generator is deactivated and provides no source signal.

13. The method as claimed in claim 10, comprising identifying a phase trajectory of the first source signal and calculating the pre-determined phase setting value based on the first phase trajectory.

14. The method as claimed in claim 10, wherein upon loading the selected pre-determined phase setting value, the second source signal is set to the chosen phase trajectory.

15. The method as claimed in claim 10, wherein the memory circuit comprises a data input for receiving a data signal, and a load input for receiving a load signal to load the selected pre-determined phase setting value from the phase setting input.

* * * * *